US012727276B2

(12) United States Patent
Cho

(10) Patent No.: US 12,727,276 B2
(45) Date of Patent: Sep. 1, 2026

(54) IMAGE SENSING DEVICE

(71) Applicant: SK hynix Inc., Icheon-si (KR)

(72) Inventor: Sung Wook Cho, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 344 days.

(21) Appl. No.: 18/613,873

(22) Filed: Mar. 22, 2024

(65) Prior Publication Data

US 2025/0151439 A1 May 8, 2025

(30) Foreign Application Priority Data

Nov. 3, 2023 (KR) ........................ 10-2023-0150695

(51) Int. Cl.
*H10F 39/00* (2025.01)
*H10F 39/18* (2025.01)

(52) U.S. Cl.
CPC ......... *H10F 39/807* (2025.01); *H10F 39/182* (2025.01); *H10F 39/8053* (2025.01); *H10F 39/8063* (2025.01)

(58) Field of Classification Search
None
See application file for complete search history.

(56) References Cited

U.S. PATENT DOCUMENTS

2017/0317117 A1* 11/2017 Ukigaya ............. H10F 39/8063
2021/0288192 A1 9/2021 Yokogawa et al.
2021/0366969 A1* 11/2021 Bak ..................... H10F 39/8063
2021/0400221 A1* 12/2021 Lee ...................... H04N 25/134
2022/0208808 A1* 6/2022 Kwag .................. H10F 39/807
2022/0246650 A1* 8/2022 Jang ...................... G01S 7/4816
2022/0368844 A1* 11/2022 Lee ...................... H04N 25/704
2023/0011124 A1 1/2023 Nagatomo
2023/0101569 A1* 3/2023 Cha ...................... H04N 23/843
348/606
2024/0234466 A1* 7/2024 Lee ....................... H10F 39/807
2025/0160024 A1* 5/2025 Cho ...................... H10F 39/807

* cited by examiner

*Primary Examiner* — Alexander G Ghyka
(74) *Attorney, Agent, or Firm* — Ashurst Perkins Coie US LLP

(57) ABSTRACT

Disclosed is an image sensing device, including: a pixel array that includes a plurality of unit pixels. A unit pixel in the pixel array may include a plurality of sub-pixels, a first isolation region may be formed in an edge region of a sub-pixel, a second isolation region may extend from the first isolation region toward a central portion of the sub-pixel, the second isolation region may include: a first inner isolation region protruding in a first direction from one region of the first isolation region to the central portion of the sub-pixel, and a second inner isolation region formed on a same straight line as the first inner isolation region and protruding in a second direction from another region of the first isolation region to the central portion of the sub-pixel, and the first inner isolation region and the second inner isolation region may have sharp end portions.

20 Claims, 7 Drawing Sheets

IMAGE SENSING DEVICE

PRIORITY CLAIM AND CROSS REFERENCE TO RELATED APPLICATION

This patent document claims the priority and benefits of Korean Patent Application No. 10-2023-0150695, filed on Nov. 3, 2023, which is incorporated by reference in its entirety as part of the disclosure of this patent document.

TECHNICAL FIELD

Various embodiments of the disclosed technology relate to an image sensing device, and more particularly, to an image sensing device capable of reducing an optical loss.

BACKGROUND

An image sensing device refers to a semiconductor device that captures and converts an optical image to electrical signals. With the development of automobile, medical, computer and telecommunication industries, the demand for high-performance image sensing devices is increasing in various devices such as smart phones, digital cameras, game devices, Internet of Things, robots, security cameras, and medical micro-cameras.

The most common types of image sensing devices are charge coupled device (CCD) image sensing devices and complementary metal oxide semiconductor (CMOS) image sensing devices.

SUMMARY

The disclosed technology can be implemented in some embodiments to provide an image sensing device capable of reducing an optical loss, by forming an inner isolation region having an inclined structure.

In one aspect, an image sensing device is provided to include a pixel array that includes a plurality of unit pixels. A unit pixel in the pixel array may include a plurality of sub-pixels, a first isolation region may be formed in an edge region of a sub-pixel, a second isolation region may extend from the first isolation region toward a central portion of the sub-pixel, the second isolation region may include: a first inner isolation region protruding in a first direction from one region of the first isolation region to the central portion of the sub-pixel, and a second inner isolation region formed on a same straight line as the first inner isolation region and protruding in a second direction from another region of the first isolation region to the central portion of the sub-pixel, and the first inner isolation region and the second inner isolation region may have sharp end portions.

In some implementations, the sub-pixel may include: the first isolation region, the second isolation region, a color filter formed over the first isolation region and the second isolation region, and a microlens formed over the color filter.

In some implementations, the second isolation region may have an inclined side formed in a light incident direction of the microlens.

In some implementations, the image sensing device may include a fourth isolation region formed over the first isolation region.

In some implementations, the image sensing device may include photodiodes formed at both sides of the second isolation region.

In some implementations, the first inner isolation region may be formed at a position spaced apart from the second inner isolation region by a certain interval.

In some implementations, the sharp end portions of each of the first inner isolation region and the second inner isolation region may be located at a light incident area where light is incident on a substrate of the sub-pixel through the microlens.

In some implementations, the sharp end portions of each the first inner isolation region and the second inner isolation region may be at upper portions of the first inner isolation region and the second inner isolation region, the upper portions located closer to the microlens as compared to lower portions of the first inner isolation region and the second inner isolation region.

In another aspect, an image sensing device is provided to include: a pixel array including a plurality of unit pixels is disposed. A unit pixel may include a plurality of sub-pixels, a first isolation region may be formed in an edge region of a sub-pixel, a second isolation region may extend in a direction from the first isolation region to a central portion of the sub-pixel, the second isolation region may include: a first inner isolation region protruding in a first direction from the first isolation region of the central portion of the sub-pixel; a second inner isolation region formed on a same straight line as the first inner isolation region and protruding in a second direction from the first isolation region to the central portion of the sub-pixel, the second inner isolation region facing the first inner isolation region; a third inner isolation region protruding in a third direction from the first isolation region to the central portion of the sub-pixel that is perpendicular to the first direction; and a fourth inner isolation region formed on a same straight line as the third inner isolation region and protruding in a fourth direction from the first isolation region to the central portion of the sub-pixel, the fourth inner isolation region facing the third inner isolation region, and the first inner isolation region, the second inner isolation region, the third inner isolation region, and the fourth inner isolation region may have sharp end portions, respectively.

In some implementations, the sub-pixel may include: the first inner isolation region; the second inner isolation region; the third inner isolation region; the fourth inner isolation region; a color filter formed over the first inner isolation region, the second inner isolation region, the third inner isolation region, and the fourth inner isolation region; and a microlens formed over the color filter.

In some implementations, the second isolation region may have an inclined side formed in a light incident direction of the microlens.

In some implementations, a fourth isolation region may be formed over the first isolation region.

In some implementations, photodiodes may be formed below the color filter.

In some implementations, the first inner isolation region may be formed at a position spaced apart from the second inner isolation region by a certain interval.

In some implementations, the third inner isolation region may be formed at a position spaced apart from the fourth inner isolation region by a certain interval.

In some implementations, the sharp end portions of each of the first inner isolation region, the second inner isolation region, the third inner isolation region, and the fourth inner isolation region may be located at a light incident area where light is incident on a substrate of the sub-pixel through the microlens.

In some implementations, the first inner isolation region may have an upper portion including the sharp end portion and a lower portion having a width increasing in a direction away from the sharp end portion.

In another aspect, an image sensing device is provided to include: a pixel array in which a plurality of unit pixels is disposed. A unit pixel may include a plurality of sub-pixels, a first isolation region may be formed in an edge region of a sub-pixel, a second isolation region may be formed to extend from the first isolation region to a central portion of the sub-pixel, the second isolation region may include: a first inner isolation region protruding in a first direction from one region of the first isolation region to the central portion of the sub-pixel, and a second inner isolation region formed on a same straight line as the first inner isolation region and protruding in a second direction from another region of the first isolation region to the central portion of the sub-pixel, and the first inner isolation region and the second inner isolation region may have upper portions having a smaller width than a width of lower portions.

In some implementations, the upper portions of the first inner isolation region and second inner isolation region may be located at a light incident area where light is incident on a substrate of the sub-pixel.

Each of the first inner isolation region and the second inner isolation region may have an inclined side surface that forms an angle with respect to a surface of a substrate included in the sub-pixel.

DETAILED DESCRIPTION

Features, and certain advantages in connection with specific implementations of the disclosed technology disclosed in this patent document are described by example embodiments with reference to the accompanying drawings.

In image sensing devices with a dual photodiode (2PD) and a quad photodiode (4PD), light incident to a microlens is scattered through a deep trench isolation (DTI) region, and is input to each photodiode. In case of a small pixel, since an isolation region includes polysilicon (Poly Si), the incident light is scattered and absorbed in the isolation region at the same time, resulting in an optical loss.

In some implementations, by forming the inner isolation region having the inclined structure, it is possible to reduce a scattering amount and an absorbed amount of the incident light, thereby reducing the optical loss.

Figure 1:
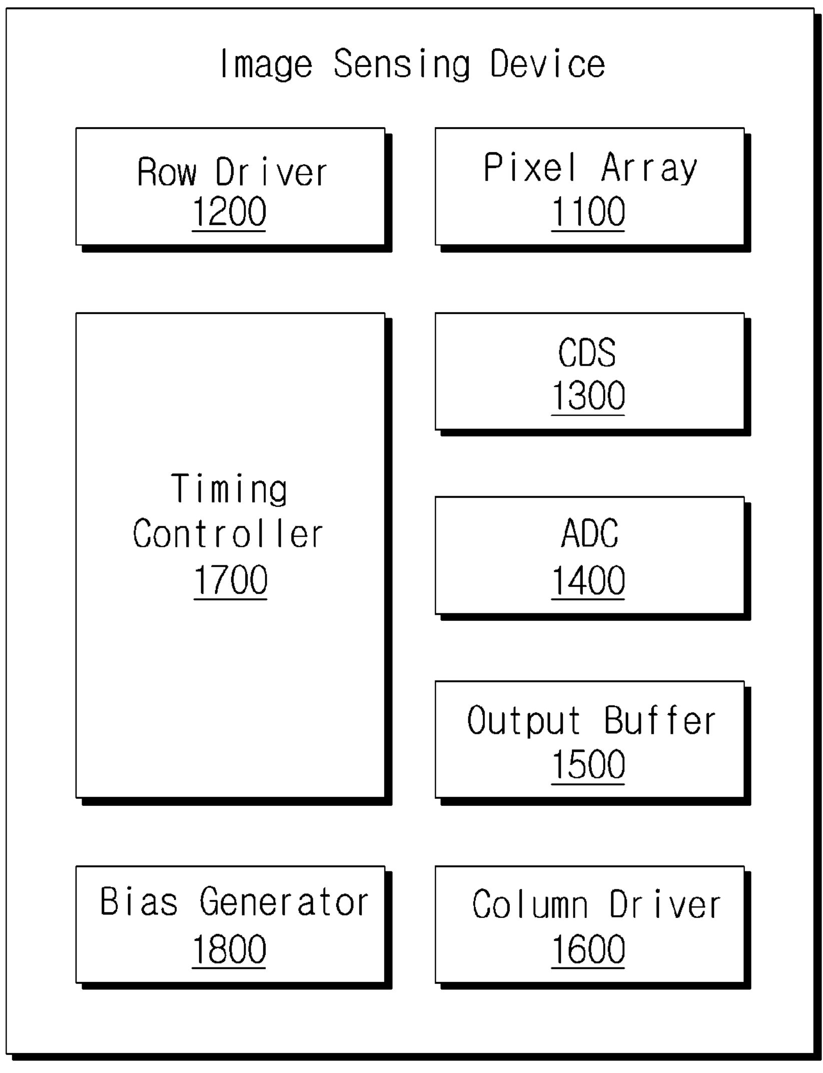
FIG. 1 is a block diagram of an image sensing device based on a first embodiment of the disclosed technology.

FIG. 1 is a block diagram of an image sensing device according to an embodiment.

Referring to FIG. 1, the image sensing device according to an embodiment may include a pixel array 1100, a row driver 1200, a correlated double sampler (CDS) 1300, an analog-digital converter (ADC) 1400, an output buffer 1500, a column driver 1600, a timing controller 1700, and a bias generator 1800. The components of the image sensing device illustrated are discussed by way of example only, and this patent document encompasses additions or omissions of components as necessary.

The pixel array 1100 may include a plurality of pixels arranged in a plurality of rows and a plurality of columns. In one embodiment, the plurality of pixels can be arranged in a two-dimensional pixel array including rows and columns. In another example, the plurality of unit imaging pixels can be arranged in a three-dimensional pixel array. The plurality of pixels may convert an optical signal into an electrical signal on a unit pixel basis or on a pixel group basis and the pixels in a pixel group share at least certain internal circuitry. The pixel array 1100 may receive driving signals, including a row selection signal, a pixel reset signal and a transmission signal, from the row driver 1200. Upon receiving the driving signal, corresponding pixels in the pixel array 1100 may be activated to perform operations corresponding to the row selection signal, the pixel reset signal, and the transmission signal.

The row driver 1200 may activate the pixel array 1100 to perform certain operations on the pixels in the corresponding row based on commands and control signals provided by the timing controller 1700. In one embodiment, the row driver 1200 may select at least one pixel arranged in at least one row of the pixel array 1100. The row driver 1200 may generate a row selection signal to select at least one row among the plurality of rows. The row driver 1200 may sequentially enable the pixel reset signal and the transmission signal for the pixels corresponding to the at least one selected row. Thus, a reference signal and an image signal, which are analog signals generated by each of the pixels of the selected row, may be sequentially transferred to the CDS 1300. At this time, the reference signal may be an electrical signal that is provided to the CDS 1300 when a sensing node of a pixel (e.g., floating diffusion node) is reset, and the image signal may be an electrical signal that is provided to the CDS 1300 when photocharges generated by the pixel are accumulated in the sensing node. A reference signal representing reset noise inherent in a pixel and an image signal representing intensity of incident light may be collectively referred to as a pixel signal.

CMOS image sensors may use the correlated double sampling (CDS) to remove undesired offset values of pixels known as the fixed pattern noise by sampling a pixel signal twice to remove the difference between these two samples. In some embodiments, the correlated double sampling (CDS) may remove the undesired offset value of pixels by comparing pixel output voltages obtained before and after photocharges generated by the pixels in response to the received incident light are accumulated in the sensing node so that only pixel output voltages based on the incident light can be measured. In one embodiment, the CDS 1300 may sequentially sample and hold the reference signal and the image signal, which are provided to each of a plurality of column lines from the pixel array 1100. Thus, the CDS 1300 may sample and hold the reference signal and the image signal which correspond to each of the columns of the pixel array 1100.

The CDS 1300 may transfer the reference signal and the image signal of each of the columns as a correlate double sampling signal to the ADC 1400 based on control signals from the timing controller 1700.

The ADC 1400 is used to convert CDS signals into digital signals for each of the columns and output the digital signal. In one embodiment, the ADC 1400 may be implemented as a ramp-compare type ADC. The ramp-compare type ADC may include a comparator circuit for comparing the analog pixel signal with a ramp signal that ramps up or down over time, and a counter that counts until the ramp signal matches the analog pixel signal. In one embodiment, the ADC 1400 may convert the correlate double sampling signal generated by the CDS 1300 for each of the columns into a digital signal, and output the digital signal.

The ADC 1400 may include a plurality of column counters corresponding to each of the columns of the pixel array 1100. Each column of the pixel array 1100 is coupled to a column counter, and image data can be generated by converting the correlate double sampling signals corresponding to each of the columns into digital signals using the column counters. In another embodiment, the ADC 1400 may include a global counter to convert the correlate double sampling signals corresponding to each of the columns into digital signals using a global code provided from the global counter.

The output buffer 1500 may temporarily hold the column-based image data provided from the ADC 1400 to output the image data. The output buffer 1500 may temporarily store the image data output from the ADC 1400 based on control signals of the timing controller 1700. The output buffer 1500 may serve as an interface to compensate for data rate differences or transmission (or processing) rate differences between the image sensing device and other devices.

The column driver 1600 may select a column of the output buffer 1500 based on a control signal from the timing controller 1700, and sequentially output the image data, which are temporarily stored in the selected column of the output buffer 1500. In one embodiment, upon receiving an address signal from the timing controller 1700, the column driver 1600 may generate a column selection signal based on the address signal and select a column of the output buffer 1500, outputting the image data as an output signal from the selected column of the output buffer 1500.

The timing controller 1700 may control at least one among the row driver 1200, the CDS 1300, the ADC 1400, the output buffer 1500, the column driver 1600, and the bias generator 1800.

The timing controller 1700 may provide a clock signal required for the operations of the respective components of the image sensing device, a control signal for timing control, and address signals for selecting a row or column, a signal that controls a level of a bias voltage applied to the pixel array 1100, and the like to at least one among the row driver 1200, the CDS 1300, the ADC 1400, the output buffer 1500, the column driver 1600 and the bias generator 1800. In an embodiment of the present disclosure, the timing controller 1700 may include a logic control circuit, a phase lock loop (PLL) circuit, a timing control circuit, a communication interface circuit and others.

The bias generator 1800 may generate a bias voltage for suppressing a dark current generated in pixels of the pixel array 1100 and supply the generated bias voltage to the pixel array 1100.

The bias voltage may be determined during a wafer probe test of the image sensing device and stored in a one-time programmable (OTP) memory. For example, the bias voltage may be experimentally determined as a value capable of maximizing a dark current suppression effect while minimizing unnecessary power consumption without impairing performance of the image sensing device.

The bias generator 1800 may generate a voltage corresponding to the bias voltage stored in the OTP memory. According to an embodiment, the OTP memory may be included in the image sensing device, and in particular, may be included in the bias generator 1800.

According to an embodiment, the bias voltage may include a plurality of values.

For example, the plurality of values may respectively correspond to a plurality of operation modes of the image sensing device. The dark currents generated at low light and that the dark currents generated at high light may be different from each other, and the bias voltage provided by the bias generator 1800 to effectively suppress the dark currents in each environment may vary depending on a mode.

Alternatively, the plurality of values may respectively correspond to a plurality of areas of the pixel array 1100. The dark currents generated may be different from each other according to positions of the pixel in the pixel array 1100, and the bias voltage provided by the bias generator 1800 to effectively suppress the dark current regardless of the position of the pixel may vary according to the area.

The bias voltage may be a negative voltage having a negative sign, but the present disclosure is not limited thereto.

Figure 2:
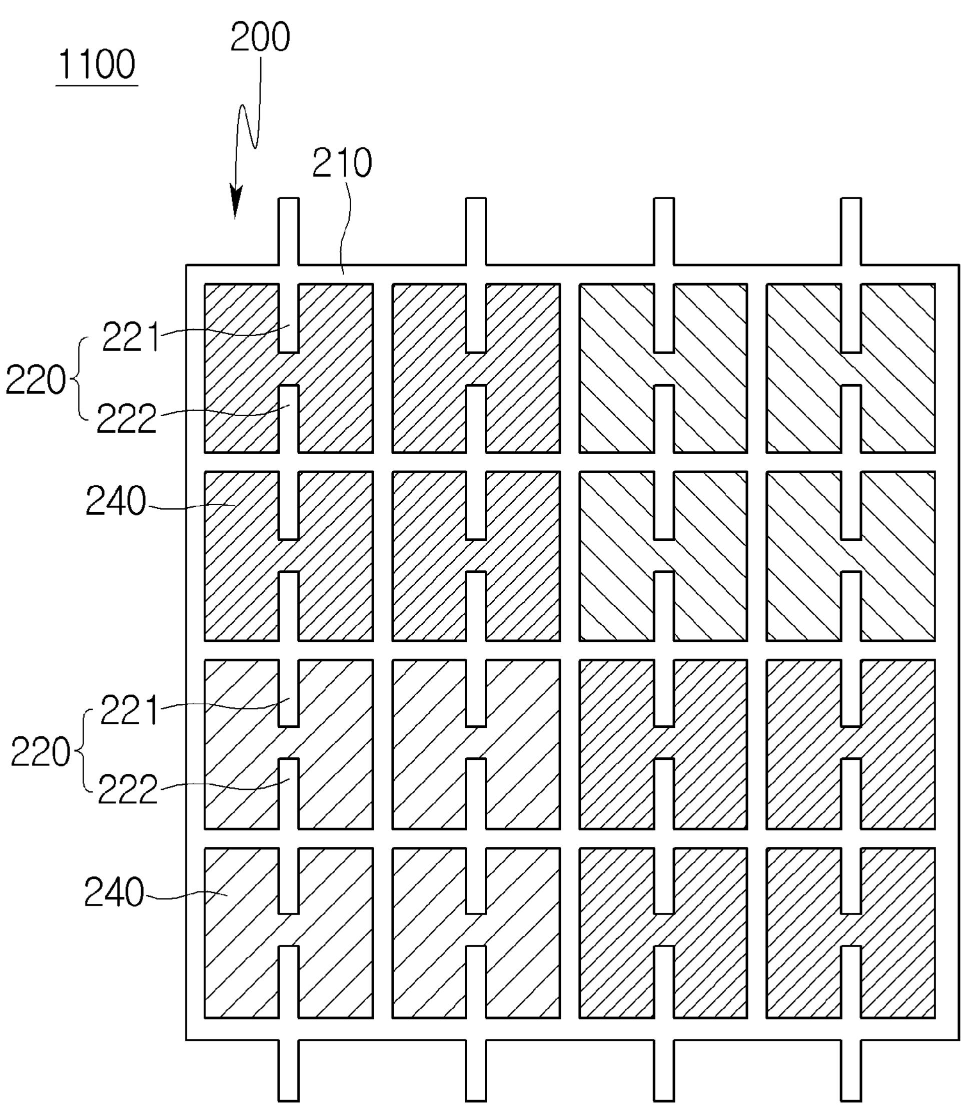
FIG. 2 is a view illustrating a pixel array based on a first embodiment of the disclosed technology.
Figure 3:
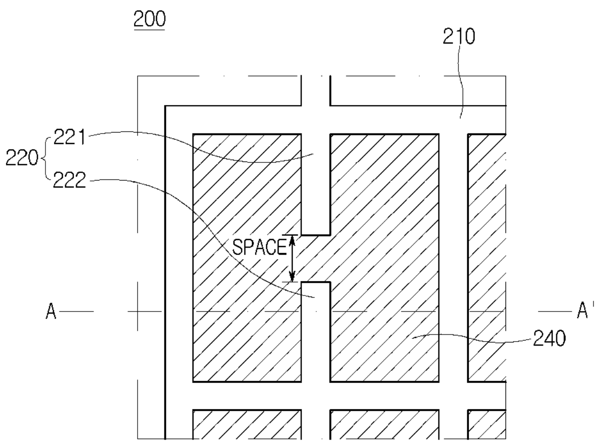
FIG. 3 is a view for describing a sub-pixel of a pixel array based on a first embodiment of the disclosed technology.

FIG. 2 is a view illustrating a pixel array based on a first embodiment, and FIG. 3 is a view illustrating a sub-pixel of the pixel array based on the first embodiment.

Referring to FIG. 2, the image sensing device based on an embodiment may be the image sensing device of a dual photodiode type.

In an embodiment, the pixel array 1100 may include a plurality of unit pixels, and each unit pixel may include four sub-pixels which include color filters of the same kinds, and two photodiodes may be formed below each of the color filter.

Referring to FIGS. 2 and 3, a first isolation region 210 may be formed in an edge region (a boundary region between sub-pixels 200) of the sub-pixel 200. In some implementation, in a plan view, the first isolation region 210 may be located to on four sides of the sub-pixel 200. The first isolation region 210 may be formed in a shape of extending vertically from the surface of the substrate so as to prevent a crosstalk among neighboring sub-pixels 200, and may be formed through a deep trench isolation (DTI) process.

The first isolation region 210 may include at least one among silicon oxynitride (SiON), silicon oxide (SiO), silicon nitride (SiN), and/or polysilicon (Poly Si).

A second isolation region 220 may be formed on a side of the first isolation region 210, which is an inside of the sub-pixel. In a plan view, the second isolation region 220 may extend in a direction from the first isolation region 210 toward a central portion of the sub-pixel 200.

The second isolation region 220 may be formed in a shape of being dug vertically deep so as to prevent a crosstalk among neighboring photodiodes and may be formed through the deep trench isolation (DTI) process.

The second isolation region 220 may include at least one among silicon oxynitride (SiON), silicon oxide (SiO), silicon nitride (SiN), and/or polysilicon (Poly Si).

In an embodiment, the second isolation region 220 may include a first inner isolation region 221, and a second inner isolation region 222.

The first inner isolation region 221 may protrude in a direction of the central portion of the sub-pixel 200 from one region of the first isolation region 210.

The second inner isolation region 222 may be formed on the same straight line as the first inner isolation region 221, and may protrude in the direction of the central portion of the sub-pixel 200 from another region of the first isolation region 210 (a region opposite to a region in which the first inner isolation region 221 is formed).

In an embodiment, the first inner isolation region 221 may be formed at a position which is spaced apart at a certain interval from the second inner isolation region 222.

Figure 4:
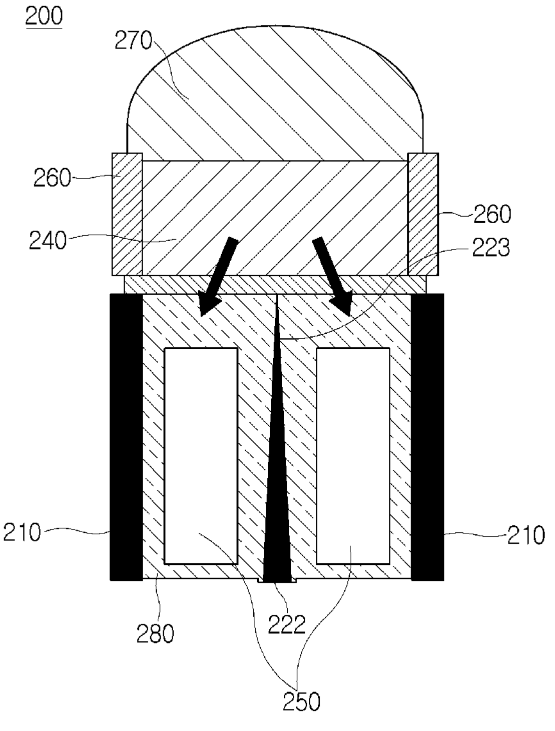
FIGS. 4 and 5 are cross-sectional views taken along line A-A' of a sub-pixel based on a first embodiment as shown in FIG. 3.
Figure 5:
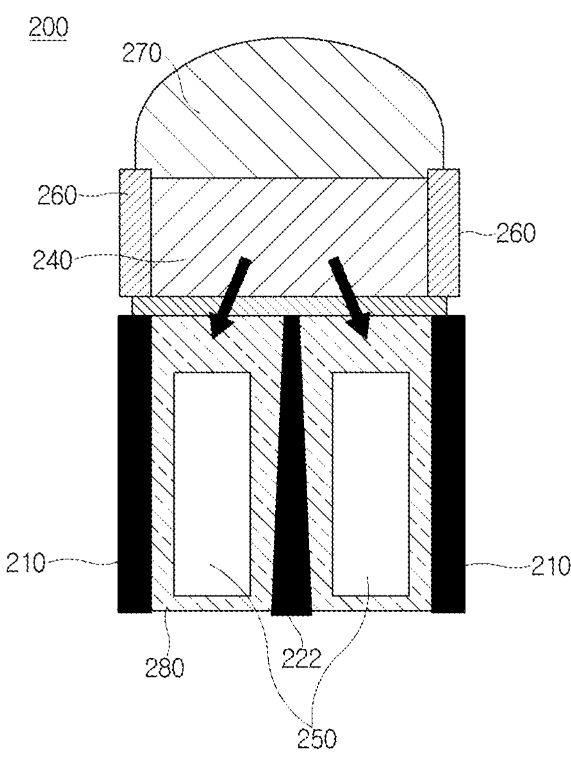

FIGS. 4 and 5 are cross-sectional views taken along line A-A' of the sub-pixel according to the first embodiment of FIG. 3.

Referring to FIG. 4, the sub-pixel 200 may include the first isolation region 210, the first inner isolation region 221, the second inner isolation region 222, a color filter 240, a photodiode 250, a fourth isolation region 260, a microlens 270, and a substrate 280. While FIG. 4 shows the second inner isolation region 222 only as the part of the second isolation region 220, the similar structure can be applied to the first inner isolation region 221.

The first isolation region 210 may be formed between neighboring sub-pixels 200.

The first inner isolation region 221 and the second inner isolation region 222 may be formed below the color filter 240.

In an embodiment, the second isolation region 220 may have a sharp end point. As compared to the example in FIG. 5 which will be explained later, the second inner isolation region 222 of the second isolation region in FIG. 4 has an end portion that is sharp at a light incident area. When the light enters the substrate through the top surface of the substrate (see arrow in FIG. 4), the sharp end portion of the second isolation region 220 may correspond to the upper portion of the second isolation region 220. The upper portion of the second isolation region including the sharp end point may be located at the light incident area where the incident light enters the substrate. While the second isolation region 220 has the sharp end portion at the top surface of the substrate 280, the second isolation region 220 may have a width generally increasing in a direction away from the top surface of the substrate 280.

The first inner isolation region 221 and the second inner isolation region 222 may have a sharp upper end portion, and the sharp upper end portion may be formed at the light incident area.

Since the end portion of the second isolation region 220 is sharp at the light incident area, it is possible to reduce a scattering amount and an absorbed amount of the incident light, thereby reducing the optical loss. Since the end portion of the second isolation region 220 is formed to be sharp, the optical loss due to light absorption and light scattering may be reduced.

In an embodiment, the second isolation region 220 may have inclined portions formed at both sides of the second isolation region 220. Thus, the second isolation region 220 has an inclined side that forms an inclination angle with respect to the surface of the substrate. An inclined portion 223 may be formed at both sides thereof in a direction of the microlens 270 to which light is input. The inclination angle of the inclined portion 223 may vary according to the setting.

Since the inclined portion 223 is formed in the direction of the microlens 270, the scattering amount and the absorbed amount of the incident light may be reduced, thereby reducing the optical loss. Since the inclined portion 223 is formed in the direction of the microlens 270 to which light is input, the optical loss due to the light absorption and the light scattering may be reduced.

Referring to FIGS. 3 to 5, in an embodiment, the first inner isolation region 221 and the second inner isolation region 222 may have upper portions having a smaller width than a width of a lower portion. While FIG. 5 shows the second inner isolation region 222 only as the part of the second isolation region 220, the similar structure can be applied to the first inner isolation region 221.

In an embodiment, the first inner isolation region 221 and the second inner isolation region 222 may have a shape in which a width thereof becomes narrower from the lower portion toward the upper portion.

The color filter 240 may be formed over the first isolation region 210 and the second isolation region 220.

The color filter 240 may be formed over the substrate 280 to filter and pass visible light input through the microlens 270. The color filter 240 may include one color filter among a blue color filter which passes only blue light from the visible light, a green color filter which passes only green light from the visible light, and a red color filter which passes only red light from the visible light.

The photodiode 250 may be formed in an inner region of the substrate 280 and located at both sides of the second isolation region 220. The photodiode 250 may include a n-type impurity region and a p-type impurity region that are vertically stacked. The n-type impurity region and the p-type impurity region may be formed through an ion injection process. The photodiode 250 is described as one example of the photoelectric conversion element which is configured to convert the incident light into electrical charges. In some implementation, the photoelectric conversion element can be as a phototransistor, a photogate, or a combination thereof, etc.

The fourth isolation region 260 may be formed over the first isolation region 210.

The microlens 270 may be formed over the color filter 240, and may serve to collect the incident light from the outside.

In an embodiment, the substrate 280 may include a single-crystalline silicon (Si) material.

Figure 6:
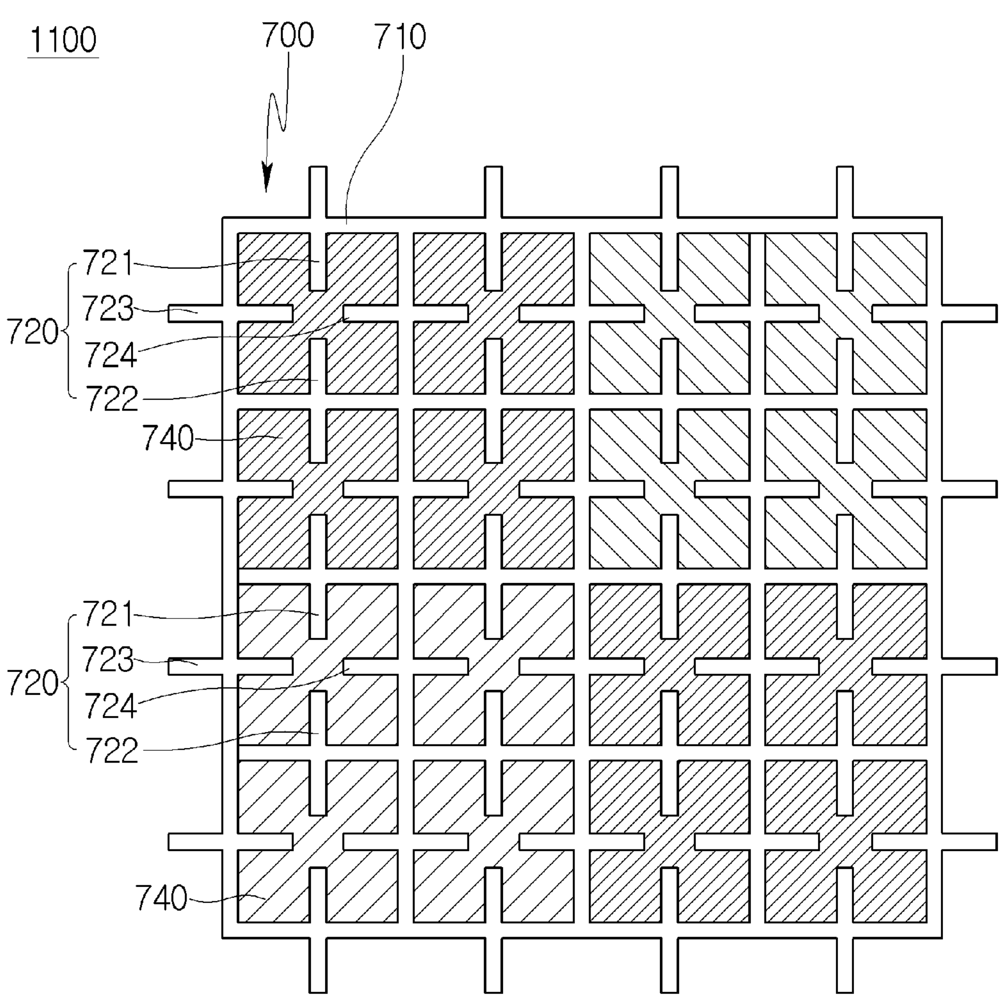
FIG. 6 is a view for describing a pixel array based on a second embodiment of the disclosed technology.

FIG. 6 is a view illustrating the pixel array according to the second embodiment of the disclosed technology. FIG. 6 is a view illustrating the sub-pixel of the pixel array based on the second embodiment of the disclosed technology.

Referring to FIG. 6, the image sensing device according to an embodiment may be an image sensing device of a quad photodiode type.

In an embodiment, the pixel array 1100 may include a plurality of unit pixels, each unit pixel may include four sub-pixels which include color filters of the same kinds, and four photodiodes may be formed below each of the color filter. The sub-pixels respond to incident light to produce sub-pixel signals that are associated with the pixel signal of the unit pixel. For example, the pixel signal generated by each unit pixel is a sum of the sub-pixel signals generated by sub-pixels within that unit pixel.

Figure 7:
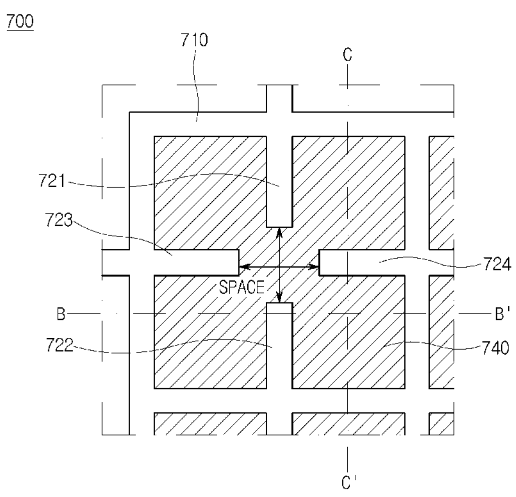
FIG. 7 is a view illustrating a sub-pixel of a pixel array based on a second embodiment of the disclosed technology.

Referring to FIGS. 6 and 7, a first isolation region 710 may be formed in an edge region (a boundary region between sub-pixels 700) of the sub-pixel 700. In some implementation, in a plan view, the first isolation region 710 may be located to on four sides of the sub-pixel 700. The first isolation region 710 may be formed in a shape of extending vertically from the surface of the substrate so as to prevent a crosstalk among neighboring sub-pixels 700, and may be formed through a deep trench isolation (DTI) process.

The first isolation region 710 may include at least one among silicon oxynitride (SiON), silicon oxide (SiO), silicon nitride (SiN), and/or polysilicon (Poly Si).

A second isolation region 720 may be formed on a side of the first isolation region 710, which is an inside of the sub-pixel. In a plan view, the second isolation region 720 may extend in the direction from the first isolation region 710 toward the central portion of the sub-pixel 700.

The second isolation region 720 may be formed in a shape of extending vertically from the surface of the substrate so as to prevent a crosstalk among neighboring photodiodes and may be formed through the deep trench isolation (DTI) process.

The second isolation region 720 may include at least one among silicon oxynitride (SiON), silicon oxide (SiO), silicon nitride (SiN), and/or polysilicon (Poly Si).

In an embodiment, the second isolation region 720 may include a first inner isolation region 721, a second inner isolation region 722, a third inner isolation region 723, and a fourth inner isolation region 724.

The first inner isolation region 721 may protrude in the direction from one region of the first isolation region 710 to the central portion of the sub-pixel 700.

The second inner isolation region 722 may be formed on the same straight line as the first inner isolation region 721, and may protrude in the direction from another region of the first isolation region 710 to the central portion of the sub-pixel 700 (a region opposite to a region in which the first inner isolation region 721 is formed).

The third inner isolation region 723 may protrude in the direction from the first isolation region 710 to the central portion of the sub-pixel, the direction perpendicular to the direction that first inner isolation region 721 protrudes.

The fourth inner isolation region 724 may be formed on the same straight line as the third inner isolation region 723, and may protrude in the direction from the first isolation region 710 to the central portion of the sub-pixel 700. The fourth inner isolation region 724 may be located to face the third inner isolation region 723.

The first inner isolation region 721 may be formed at a position which is spaced apart at a certain interval from the second inner isolation region 722.

The third inner isolation region 723 may be formed at a position which is spaced apart at a certain interval from the fourth inner isolation region 724.

Figure 8:
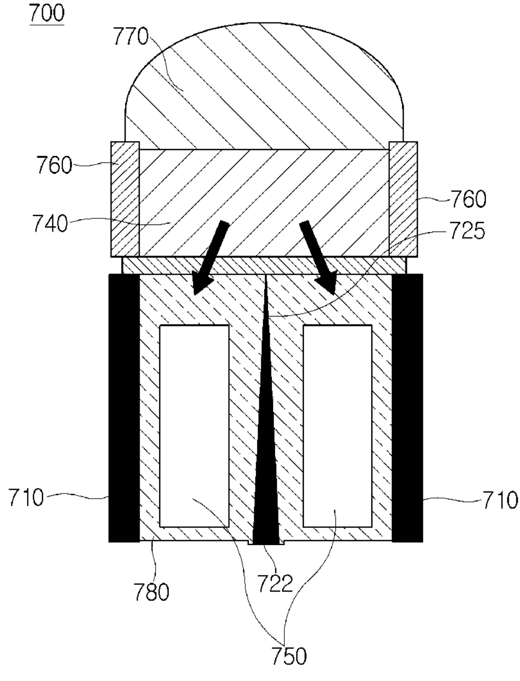
FIG. 8 is a cross-sectional view taken along line B-B' of a sub-pixel based on a second embodiment as shown in FIG. 7.
Figure 9:
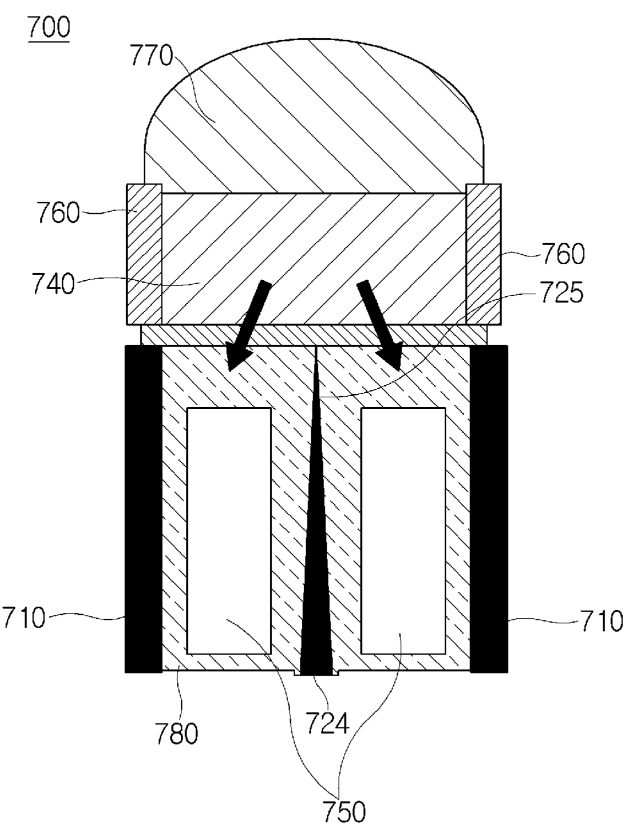
FIG. 9 is a cross-sectional view taken along line C-C' of a sub-pixel based on a second embodiment as shown in FIG. 7.

FIG. 8 is a cross-sectional view taken along line B-B' of a sub-pixel based on a second embodiment as shown in FIG. 7. FIG. 9 is a cross-sectional view taken along line C-C' of a sub-pixel based on a second embodiment as shown in FIG. 7.

Referring to FIGS. 8 and 9, the sub-pixel 700 may include the first isolation region 710, the first inner isolation region 721, the second inner isolation region 722, the third inner isolation region 723, the fourth inner isolation region 724, a color filter 740, a photodiode 750, a microlens 770, a fourth isolation region 760, and a substrate 780. While FIGS. 8 and 9 illustrate the second inner isolation region 722 and the fourth inner isolation region 724 as the part of the second isolation region 720, the similar structure can be applied to the first inner isolation region 721 and the third inner isolation region 723.

The first isolation region 710 may be formed between neighboring sub-pixels 700.

The first inner isolation region 721, the second inner isolation region 722, the third inner isolation region 723, and the fourth inner isolation region 724 may be formed below the color filter 740.

In an embodiment, the second isolation region 720 may have a sharp end portion. The second isolation region 720 may have an end portion that is sharp at a light incident area.

The first inner isolation region 721, the second inner isolation region 722, the third inner isolation region 723, and the fourth inner isolation region 724 may have a sharp upper end portion, and the upper end portion may be formed to be sharp at the light incident area.

Since the end portion of the second isolation region 720 is sharp at the light incident area, it is possible to reduce a scattering amount and an absorbed amount of the incident light, thereby reducing the optical loss. Since the end portion of the second isolation region 720 is formed to be sharp, the optical loss due to light absorption and light scattering may be reduced.

In an embodiment, the second isolation region 720 may have inclined portions 725 formed at both sides of the second isolation region. Thus, the second isolation region 220 has an inclined side that forms an inclination angle with respect to the surface of the substrate, in a direction of the microlens 770 to which light is input. The inclination angle of the inclined portion 725 may vary according to the setting.

Since the inclined portion 725 is formed in the direction of the microlens 770, the scattering amount and the absorbed amount of the incident light may be reduced, thereby reducing the optical loss. That is, since the inclined portion 725 is formed in the direction of the microlens 770 to which light is input, the optical loss due to the light absorption and the light scattering may be reduced.

The color filter 740 may be formed over the first isolation region 710 and the second isolation region 720.

The color filter 740 may be formed over the substrate 780 to filter and pass visible light through the microlens 770. The color filter 740 may include one color filter among a blue color filter which passes only blue light from the visible light, a green color filter which passes only green light from the visible light, and a red color filter which passes only red light from the visible light.

The photodiode 250 may be formed below the color filter 740.

The photodiode 750 may be formed in an inner region of the substrate 780 and located at both sides of the second isolation region 720. The photodiode 750 may include a n-type impurity region and a p-type impurity region that are vertically stacked. The n-type impurity region and the p-type impurity region may be formed through an ion injection process. As discussed above, the photodiode 750 is one example of the photoelectric conversion element which is configured to convert the incident light into electrical charges. In some implementation, the photoelectric conversion element can be as a phototransistor, a photogate, or a combination thereof, etc.

The fourth isolation region 760 may be formed over the first isolation region 710.

The microlens 770 may be formed over the color filter 740, and may serve to collect the incident light from the outside.

In an embodiment, the substrate 780 may include a single-crystalline silicon (Si) material.

While various embodiments have been described above, variations and improvements of the disclosed embodiments and other embodiments may be made based on what is described or illustrated in this document.

What is claimed is:

1. An image sensing device, comprising:
a pixel array that includes a plurality of unit pixels,
wherein a unit pixel in the pixel array includes a plurality of sub-pixels,
wherein a first isolation region is formed in an edge region of a sub-pixel,
wherein a second isolation region extends from the first isolation region toward a central portion of the sub-pixel,
wherein the second isolation region comprises:
a first inner isolation region protruding in a first direction from one region of the first isolation region to the central portion of the sub-pixel, and
a second inner isolation region formed on a same straight line as the first inner isolation region and protruding in a second direction from another region of the first isolation region to the central portion of the sub-pixel, and
wherein the first inner isolation region and the second inner isolation region have sharp end portions.

2. The image sensing device of claim 1, wherein the sub-pixel comprises:
the first isolation region,
the second isolation region,
a color filter formed over the first isolation region and the second isolation region, and
a microlens formed over the color filter.

3. The image sensing device of claim 2,
wherein the second isolation region has an inclined side formed in a light incident direction of the microlens.

4. The image sensing device of claim 2, further comprising:
a fourth isolation region formed over the first isolation region.

5. The image sensing device of claim 2, further comprising:
photodiodes formed at both sides of the second isolation region.

6. The image sensing device of claim 1,
wherein the first inner isolation region is formed at a position spaced apart from the second inner isolation region by a certain interval.

7. The image sensing device of claim 2, wherein the sharp end portions of each of the first inner isolation region and the second inner isolation region are located at a light incident area where light is incident on a substrate of the sub-pixel through the microlens.

8. The image sensing device of claim 2, wherein the sharp end portions of each the first inner isolation region and the second inner isolation region are at upper portions of the first inner isolation region and the second inner isolation region, the upper portions located closer to the microlens as compared to lower portions of the first inner isolation region and the second inner isolation region.

9. An image sensing device, comprising:
a pixel array including a plurality of unit pixels,
wherein a unit pixel comprises a plurality of sub-pixels,
wherein a first isolation region is formed in an edge region of a sub-pixel,
wherein a second isolation region extends in a direction from the first isolation region to a central portion of the sub-pixel,
wherein the second isolation region comprises:
a first inner isolation region protruding in a first direction from the first isolation region of the central portion of the sub-pixel;
a second inner isolation region formed on a same straight line as the first inner isolation region and protruding in a second direction from the first isolation region to the central portion of the sub-pixel, the second inner isolation region facing the first inner isolation region;
a third inner isolation region protruding in a third direction from the first isolation region to the central portion of the sub-pixel that is perpendicular to the first direction; and
a fourth inner isolation region formed on a same straight line as the third inner isolation region and protruding in a fourth direction from the first isolation region to the central portion of the sub-pixel, the fourth inner isolation region facing the third inner isolation region, and
wherein the first inner isolation region, the second inner isolation region, the third inner isolation region, and the fourth inner isolation region have sharp end portions, respectively.

10. The image sensing device of claim 9, wherein the sub-pixel comprises:
the first inner isolation region;
the second inner isolation region;
the third inner isolation region;
the fourth inner isolation region;
a color filter formed over the first inner isolation region, the second inner isolation region, the third inner isolation region, and the fourth inner isolation region; and
a microlens formed over the color filter.

11. The image sensing device of claim 10,
wherein the second isolation region has an inclined side formed in a light incident direction of the microlens.

12. The image sensing device of claim 10,
wherein a fourth isolation region is formed over the first isolation region.

13. The image sensing device of claim 10,
wherein photodiodes are formed below the color filter.

14. The image sensing device of claim 9,
wherein the first inner isolation region is formed at a position spaced apart from the second inner isolation region by a certain interval.

15. The image sensing device of claim 9,
wherein the third inner isolation region is formed at a position spaced apart from the fourth inner isolation region by a certain interval.

16. The image sensing device of claim 10, wherein the sharp end portions of each of the first inner isolation region, the second inner isolation region, the third inner isolation region, and the fourth inner isolation region are located at a light incident area where light is incident on a substrate of the sub-pixel through the microlens.

17. The image sensing device of claim 10, wherein the first inner isolation region has an upper portion including the sharp end portion and a lower portion having a width increasing in a direction away from the sharp end portion.

18. An image sensing device, comprising:
a pixel array in which a plurality of unit pixels is disposed,
wherein a unit pixel comprises a plurality of sub-pixels,
wherein a first isolation region is formed in an edge region of a sub-pixel,
wherein a second isolation region is formed to extend from the first isolation region to a central portion of the sub-pixel,
wherein the second isolation region comprises:

a first inner isolation region protruding in a first direction from one region of the first isolation region to the central portion of the sub-pixel, and a second inner isolation region formed on a same straight line as the first inner isolation region and protruding in a second direction from another region of the first isolation region to the central portion of the sub-pixel, and wherein the first inner isolation region and the second inner isolation region have upper portions having a smaller width than a width of lower portions.

19. The image sensing device of claim 18, wherein the upper portions of the first inner isolation region and second inner isolation region are located at a light incident area where light is incident on a substrate of the sub-pixel.

20. The image sensing device of claim 18, wherein each of the first inner isolation region and the second inner isolation region has an inclined side surface that forms an angle with respect to a surface of a substrate included in the sub-pixel.

* * * * *